(12) United States Patent
Khwa et al.

(10) Patent No.: US 12,040,011 B2
(45) Date of Patent: Jul. 16, 2024

(54) MEMORY DEVICE WITH LOW POWER CONSUMPTION AND OPERATION METHOD THEREOF

(71) Applicant: Taiwan Semiconductor Manufacturing Company, Ltd., Hsinchu (TW)

(72) Inventors: Win-San Khwa, Taipei (TW); Yen-Cheng Chiu, Pingtung (TW); Je-Min Hung, Kaohsiung (TW); Yi-Lun Lu, New Taipei (TW); Jui-Jen Wu, Hsinchu (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 175 days.

(21) Appl. No.: 17/842,752

(22) Filed: Jun. 16, 2022

(65) Prior Publication Data

US 2023/0290402 A1 Sep. 14, 2023

Related U.S. Application Data

(60) Provisional application No. 63/318,784, filed on Mar. 11, 2022.

(51) Int. Cl.
*G11C 11/4091* (2006.01)
*G11C 11/408* (2006.01)
*G11C 11/4094* (2006.01)

(52) U.S. Cl.
CPC ...... *G11C 11/4091* (2013.01); *G11C 11/4085* (2013.01); *G11C 11/4094* (2013.01)

(58) Field of Classification Search
None
See application file for complete search history.

(56) References Cited

U.S. PATENT DOCUMENTS

2015/0221391 A1* 8/2015 Tseng ............... G11C 16/10
365/185.22

* cited by examiner

*Primary Examiner* — Alfredo Bermudez Lozada
(74) *Attorney, Agent, or Firm* — JCIPRNET (57) ABSTRACT

A memory device that includes a memory array and a pre-charge selecting circuit is introduced. The memory array includes a plurality of memory cells that are coupled to a plurality of bit lines and a plurality of word lines, wherein the plurality of word lines are configured to receive an input vector. The pre-charge selecting circuit is configured to selectively pre-charge a selected bit line according to a value of the input vector. The pre-charge selecting circuit is configured to determine whether the value of the input vector is less than a predefined threshold, and generate a gated pre-charge signal to skip pre-charging the selected bit line in response to determining that the value of the input vector is less than the predefined threshold.

18 Claims, 6 Drawing Sheets

MEMORY DEVICE WITH LOW POWER CONSUMPTION AND OPERATION METHOD THEREOF

CROSS-REFERENCE TO RELATED APPLICATION

This application claims the priority benefit of U.S. provisional application Ser. No. 63/318,784, filed on Mar. 11, 2022. The entirety of the above-mentioned patent application is hereby incorporated by reference herein and made a part of this specification.

BACKGROUND

Neural networks are widely used in many data processing applications, in which a dominant computation of the neural networks is in a form of a product-sum operation of inputs and weights. The potential applications of the neural networks are tremendous, but the neural networks are limited by high power consumption.

In-memory computing and near-memory computing techniques are promising approaches for energy-efficient neural network applications, in which memory operations are involved in the computations of the neural networks. A typical memory device includes a plurality of memory cells and a sense amplifier that is coupled to the memory cells. The sense amplifier may read data in the memory cells through a plurality of bit lines coupled to the memory cells. In a read operation, selected bit lines are pre-charged to a predetermined voltage level in a pre-charging stage, and the sense amplifier is enabled to sense the data through the selected bit lines in a sensing stage. However, the pre-charging stage and the sensing stage are always performed to sense data in the selected bit lines regardless of value of input vector. Since pre-charging stage and the sensing stage of the read operation consumes a large amount of power, the power consumption of the memory device is relatively high. It is desired for a creative design of the memory device that reduces power consumption and improve performance of the memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A through FIG. 4C are schematic diagrams of a pre-charge selecting circuit of a memory device in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
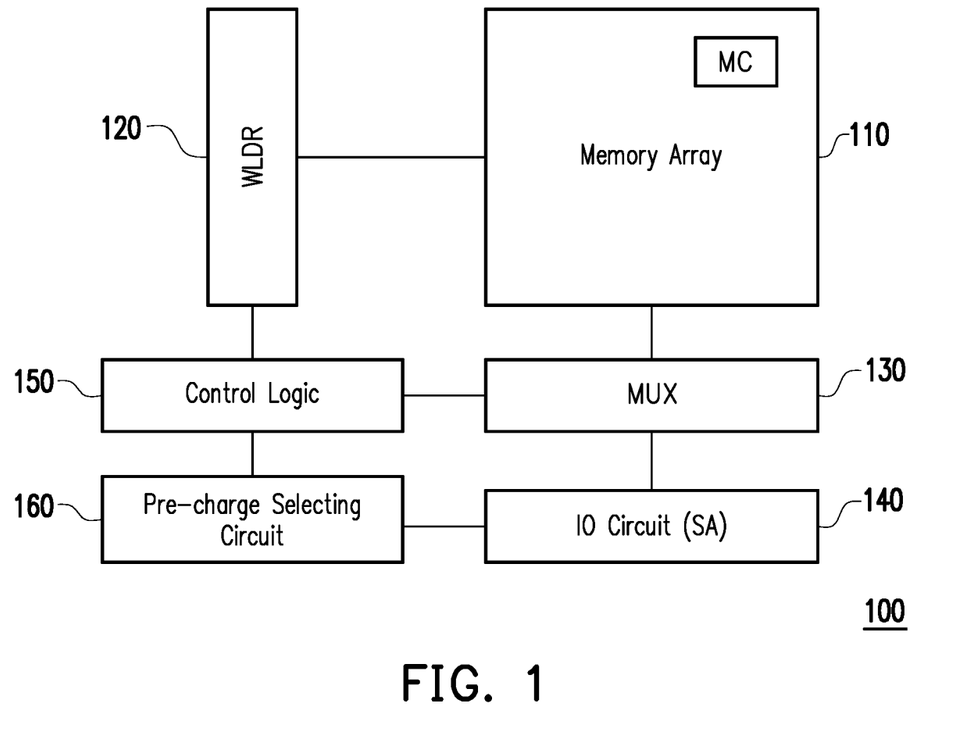
FIG. 1 is a schematic diagram illustrating a memory device in accordance with some embodiments.

FIG. 1 illustrates a schematic diagram of a memory device 100 in accordance with some embodiments. The memory device 100 may include a memory array 110, a word line driver 120, a multiplexer 130, an input/output (TO) circuit 140, a control logic 150 and a pre-charge selecting circuit 160. The memory array 110 may include a plurality of memory cells MC arranged in an array structure including rows and columns. The memory array 110 may further includes a plurality of bit lines (not shown), word lines (not shown) and source lines (not shown) coupled to the memory cells MC, in which memory operations, such as a read operation, a program operation and an erase operation, are performed through the bit lines, the word lines and the source lines of the memory device 100. It is noted that the type of the memory array 110 is not limited in the disclosure. The memory array 100 may be a volatile memory array or a non-volatile memory array, such as a static random-access memory (SRAM), a dynamic random-access memory (DRAM), a resistive random-access memory (RRAM), a magnetoresistive random-access memory (MRAM), a phase-change random-access memory (PCRAM), or any other type of memory.

The word line driver 120 is coupled to the memory array 110 and is configured to drive the word lines of the memory array 110. The multiplexer 130 is coupled to the memory array 110, and is configured to select at least one memory cell MC in the memory array 110 for a memory operation. The IO circuit 140 is coupled to the memory array 110 through the multiplexer 130, and is configured to perform the memory operation to the at least one selected memory cell MC of the memory array 110. The IO circuit 140 may include a sense amplifier (SA) that is configured to read data in the at least one selected memory cell MC in a read operation through at least one bit line. The SA may read the data in the at least one selected memory cells by sensing the values from the bit lines coupled to the at least one selected memory cell MC. The IO circuit 140 may further include a write driver (WD) that is configured to write data to the at least one selected memory cell MC in a program operation. The control logic 150 is configured to generate control signals for controlling operations of the word line driver 120, the multiplexer 130, the IO circuit 140 and the pre-charge selecting circuit 160.

In some embodiments, the memory device 100 is utilized in a computation of a neural network, such as a convolutional neural network (CNN), a recurrent neural network (RNN), or a multi-layer perceptrons (MLP). For example, a product-sum operation for the neural network may be performed in a word-wise input and a bit-wise weight manner, in which the weights for calculating the product-sum operation are obtained from the bit lines of the memory device 100, and the inputs for calculating the product-sum operation is obtained to the word lines of the memory devices. The inputs and the weights for the product-sum operation may be in form of an input vector and a weight vector, respectively. In some embodiments, the input vector is available prior to a read operation, while the weight vector is read out from the memory array 110 in a bit-wise manner via the read operation. The weight vector and the input vector may be passed to an arithmetic block to perform the product-sum operation, in which the arithmetic block may be located inside or outside the memory device 100. For example, when a near-computing technique is utilized, the weight vector and the input vector are passed to arithmetic block that are outside of the memory array 110.

A product-sum operation for a neural network application may include a multiplying operation and a summing operation, in which a multiplicand is multiplied to a multiplier to obtain a multiplying result in the multiplying operation. If the either the multiplicand or the multiplier is a significantly small value (i.e., zero value or a very small value), the multiplying result would be zero or a very small value. As such, the product-sum operation of the input vector and the weight vector in which the value of the input vector or the weight vector is significantly small may be skipped without scarifying much accuracy. For example, the product-sum operation, which consumes a large amount of power for pre-charging the bit lines and sensing data, is ineffectual (e.g., meaningless) when the input vector is a zero vector. In some embodiments, the pre-charge selecting circuit 160 is configured to selectively pre-charge at least one selected bit line based on the value of the input vector based on a sparsity of the input vector. For example, when the value of the input vector is less than a predefined threshold, the pre-charge selecting circuit 160 is configured to skip pre-charging the at least one selected bit line to save power consumption. In some embodiments, when the value of the input vector is less than the predefined threshold, the sense amplifier in the IO circuit 140 is disabled to further reduce power consumption. In other words, when the value of the input vector is less than the predefined threshold, the read operation for reading the weight vector for the product-sum operation may be skipped to save power consumption. When the value of the input vector is greater than or equal to the predefined threshold, the pre-charge selecting circuit 160 is configured to pre-charge the at least one selected bit line for the read operation as normal. In this way, the pre-charging operation and/or the sensing operation is selectively executed based on the sparsity of the input vector, and the power consumption for the product-sum operation which involve the pre-charging operation and the sensing operation is reduced.

Figure 2:
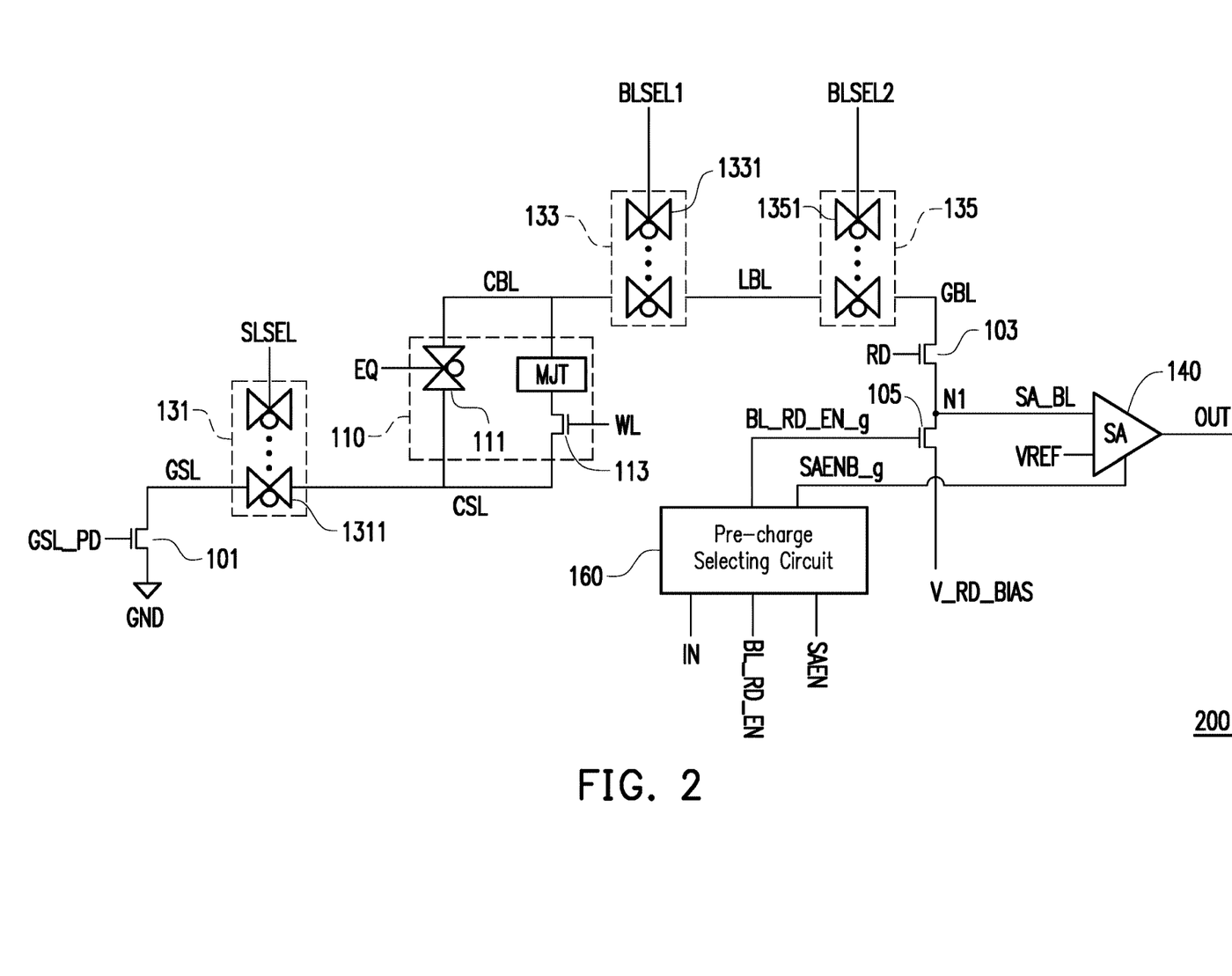
FIG. 2 is a schematic diagram illustrating a detailed structure of a memory device in accordance with some embodiments.

FIG. 2 illustrates a detailed structure of a memory device 200 in accordance with some embodiments. Same elements of the memory device 200 in FIG. 2 and the memory device 100 in FIG. 1 are represented by same reference numbers. Referring to FIG. 2, the memory device 200 may include a source switch 101, in which a first terminal of the source switch 101 receives a reference voltage GND, a second terminal of the source switch 101 is coupled to a global source line GSL, and a control terminal of the source switch 101 receives a control signal GSL_PD. The source switch 101 may perform a switching operation based on the control signal GSL_PD to provide the reference voltage GND to the global source line GSL.

The memory device 200 may further include a source line (SL) selecting circuit 131 that is configured to select a cell source line CSL to be coupled to the global source line GSL based on a SL selecting signal SLSEL. The SL selecting circuit 131 may include a plurality of transmission gates 1311 that are controlled by the SL selecting signal SLSEL to selectively connect the selected cell source line CSL to the global source line GSL. In some embodiments, the selecting signal SLSEL is generated by a control logic (i.e., control logic 150 in FIG. 1) of the memory device.

In some embodiments, the memory array 110 of the memory device 200 is a magnetoresistive random access memory (MRAM) array. Referring to FIG. 2, the memory array 110 may include a MRAM cell that is coupled to a cell bit line CBL, a word line WL and a cell source line CSL. It is noted that the MRAM cell is taken for illustration purpose only, other type of memory cell falls within the scope of the disclosure. The MRAM cell may include a magnetic tunnel junction (MTJ) and a switch 113, in which a control terminal of the switch 113 is coupled to the world line WL, a first terminal of the switch 113 is coupled to the MTJ and a second terminal of the switch 113 is coupled to the cell source line CSL. The memory array 110 may further include a transmission gate 111 that is coupled between the cell bit line CBL and the cell source line CSL. The transmission gate 111 may have a control terminal that receives an equalization signal EQ, and the transmission gate 111 is configured to equalize the voltage level in the cell bit line CBL and the cell source line CSL based on the equalization signal EQ. The transmission gate 111 may be a transistor-based switch in some embodiments.

The memory device 200 may further include a bit line (BL) selecting circuits 133 and 135, in which the BL selecting circuit 133 is configured to selectively connect the cell bit line CBL to a local bit line LBL based on a BL selecting signal BLSEL1, and the BL selecting circuit 135 is configured to selectively connect the local bit line LBL to a global bit line GBL based on a BL selecting signal BLSEL2. In other words, the BL selecting circuits 133 and 135 are configured to select the cell bit line CBL to be connected to the global bit line GBL. Each of the BL selecting circuits 133 and 135 may include a plurality of transmission gates which are transistor-based switches in some embodiments. For example, the BL selecting circuits 133 includes a plurality of transmission gates 1331 that are controlled by the BL selecting signal BLSEL1; and the BL selecting circuits 135 includes a plurality of transmission gates 1351 that are controlled by the BL selecting signal BLSEL2.

In some embodiments, the memory device 200 further includes a switch 103 that is coupled between the BL selecting circuit 135 and a connection node N1. The switch 103 receives a control signal RD via a control terminal of the switch 103, and is configured to perform a switching operation based on the control signal RD. In a read operation of the memory device 200, the switch 103 may be switched on to provide data from the global bit line GBL to the sense amplifier 140 via the connection node N1. In some embodiments, the switch 103 is a transistor, but the disclosure is not limited thereto.

The pre-charge selecting circuit 160 may receive an input vector IN, a read enabling signal BL_RD_EN and a sensing enabling signal SAEN, and generate a gated pre-charge signal BL_RD_EN_g and a gated sensing signal SAENB_g based on the input vector IN, the read enabling signal BL_RD_EN and the sensing enabling signal SAEN. The gated sensing signal SAENB_g is an active low signal in some embodiments. In some embodiments, the pre-charge selecting circuit 160 is configured to generate the gated pre-charge signal BL_RD_EN_g and a gated sensing signal SAENB_g according to a comparison between a value of the input vector IN and a predefined threshold. For example, when the value of the input vector IN is less than the predefined threshold, the pre-charge selecting circuit 160 may generate the gated pre-charge signal BL_RD_EN_g and the gated sensing signal SAENB_g, so as to skip pre-charging the global bit line GBL and to disable the sense amplifier 140. Detailed description about the structure and operations of the pre-charge selecting circuit 160 are provided with reference to FIG. 3 through FIG. 4C.

The memory device 200 may further include a pre-charging switch 105 that is controlled by the gated pre-charge signal BL_RD_EN_g. The pre-charging switch 105 may include a first terminal being coupled to the connection node N1, and a second terminal that receives a pre-charge voltage V_RD_BIAS for pre-charging the global bit line GBL in a read operation. The pre-charging switch 105 may further includes a control terminal that receives the gated pre-charge signal BL_RD_EN_g from the pre-charge selecting circuit 160. When the gated pre-charge signal BL_RD_EN_g is not asserted to the control terminal of the pre-charging switch 105, the pre-charging switch 105 is switched off to skip pre-charging the global bit line GBL. When the gated pre-charge signal BL_RD_EN_g is not asserted to the control terminal of the pre-charging switch 105, the pre-charging switch 105 is switched on to pre-charge the global bit line GBL. In some embodiments, the pre-charging switch 105 is switched on to pre-charge the global bit line GBL when the value of the input vector IN is greater than or equal to the predefined threshold; and the pre-charging switch 105 is switched off to skip pre-charging the global bit line GBL when the value of the input vector IN is less than the predefined threshold.

In some embodiments, the sense amplifier 140 is coupled to the pre-charge selecting circuit 160 to receive the gated sensing signal SAENB_g, and the sense amplifier 140 is controlled by the gated sensing signal SAENB_g. When the gated sensing signal SAENB_g is asserted to the sense amplifier 140, the sense amplifier 140 may be disabled. When the gated sensing signal SAENB_g is not asserted to the sense amplifier 140, the sense amplifier 140 may be enabled to perform the sensing operation. In some embodiments, when the pre-charge selecting circuit 160 determines that the value of the input vector IN is less than the predefined threshold, the pre-charge selecting circuit 160 asserts the gated sensing signal SAENB_g to the sense amplifier 140 to disable the sense amplifier 140. When the pre-charge selecting circuit 160 determines that the value of the input vector IN is greater than or equal to the predefined threshold, the pre-charge selecting circuit 160 does not assert the gated sensing signal SAENB_g to the sense amplifier 140. In a sensing operation performed the sense amplifier 140, the sense amplifier 140 of the memory device 200 is configured to sense a value of a BL signal SA_BL from the global bit line GBL. In some embodiments, the sense amplifier 140 includes a first input terminal, a second input terminal and an output terminal, in which the first input terminal receives the BL signal SA_BL, and the second input terminal receives a reference voltage VREF. The sense amplifier 140 may amplify a difference between the reference voltage VREF and the BL signal SA_BL to generate an output signal OUT at the output terminal of the sense amplifier. In some embodiments, the sense amplifier 140 is configured to sense the value of a weight vector which is used in a product-sum operation for a neural network application.

Figure 3:
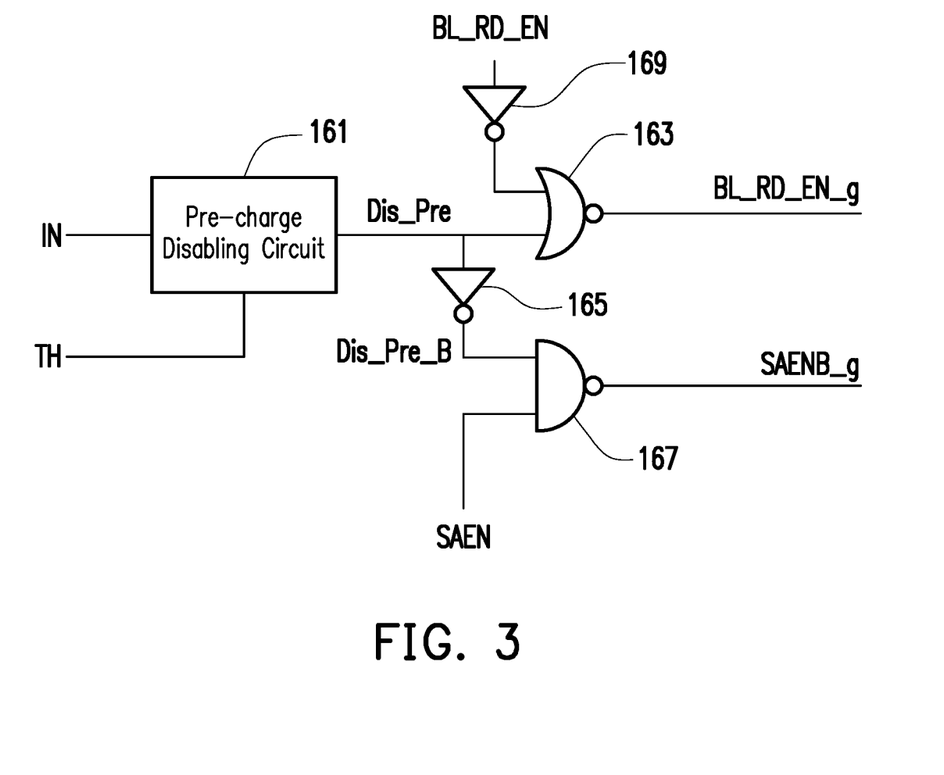
FIG. 3 is a schematic diagram illustrating a pre-charge selecting circuit of a memory device in accordance with some embodiments.

FIG. 3 illustrates a schematic diagram of the pre-charge selecting circuit 160 in accordance with some embodiments. The pre-charge selecting circuit 160 may include a pre-charge disabling circuit 161, a NOR logic gate 163 (also referred to as a first logic circuit), a NOT logic gate 165 (also referred to as a second logic circuit) and a NAND logic gate 167 (also referred to as a third logic circuit) and a NOT logic gate 169 (also referred to as an inverter). The pre-charge disabling circuit 161 may receive an input vector IN and a predefined threshold TH, compare the input vector IN and the predefined threshold TH, and generate a disabling signal Dis_Pre according to a comparison result of the input vector IN and the predefined threshold TH. In some embodiments, when the pre-charge disabling circuit 161 determines that the input vector IN is less than the predefined threshold TH, the pre-charge disabling circuit 161 generates the disabling signal Dis_Pre. In some embodiments, the disabling signal Dis_Pre has a first logic state (i.e., logic state "1") when the input vector IN is less than the predefined threshold TH; and the disabling signal Dis_Pre has a second logic state (i.e., logic state "0) when the input vector IN is greater than or equal to the predefined threshold TH.

The NOT logic gate 169 may invert the read enabling signal BL_RD_EN to generate an inverted read enabling signal. The NOR logic gate 163 may receive the disabling signal Dis_Pre and the inverted read enabling signal, and is configured to perform a NOR logic operation (also referred to as a first logic operation) on the disabling signal Dis_Pre and the inverted read enabling signal to generate the gated pre-charge signal BL_RD_EN_g. In some embodiments, the gated pre-charge signal BL_RD_EN_g has the first logic state (i.e., logic state of "1") when the input vector IN is greater than or equal to the predefined threshold TH. The gated pre-charge signal BL_RD_EN_g may have the second logic state (i.e., logic state of "0") when the input vector IN is less to the predefined threshold TH. Because the gated pre-charge signal BL_RD_EN_g controls the pre-charging switch 105, the pre-charging switch 105 is switched off and the global bit line GLB is not pre-charged when the value of the input vector IN is less to the predefined threshold TH.

The NOT logic gate 165 is coupled to the pre-charge disabling circuit 161 to receive the disabling signal Dis_Pre, and is configured to perform a NOT operation (also referred to as a second logic operation) to generate a signal Dis_Pre_B. The NOT operation may refer to as an inverting operation which is configured to invert the bit value of the disabling signal Dis_Pre to generate the bit value of signal Dis_Pre_B. The NAND logic gate 167 may receive the signal Dis_Pre_B and the sensing enabling signal SAEN, and the NAND logic gate 167 is configured to perform a NAND operation (also referred to as a third logic operation) on the signal Dis_Pre_B and the sensing enabling signal SAEN to generate the gated sensing signal SAENB_g. The gated sensing signal SAENB_g is provided to the sense amplifier (i.e., sense amplifier 140). In some embodiments, the gated sensing signal SAENB_g is configured to disable the sense amplifier 140 when the input vector IN is less to the predefined threshold TH; and the gated sensing signal SAENB_g is configured to enable the sense amplifier 140 when it determines that the input vector IN is greater than or equal to the predefined threshold TH. In some embodiments, the gated sensing signal SAENB_g may have the first logic state of "1" when the input vector IN is less than the predefined threshold TH; and the gated sensing signal SAENB_g may have the second logic state of "0" when the input vector IN is greater than or equal to the predefined threshold TH.

Figure 4A:
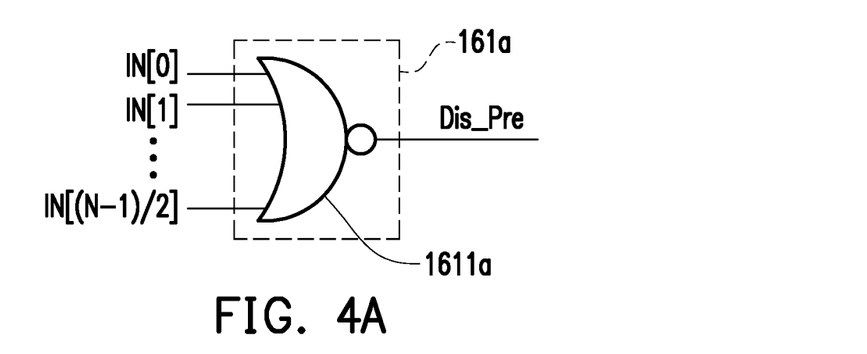

FIG. 4A illustrates a schematic diagram of a pre-charge disabling circuit 161a in accordance with some embodiments. The pre-charge disabling circuit 161a may be same as the pre-charge disabling circuit 161 of the pre-charge selecting circuit 160 in FIG. 2. The pre-charge disabling circuit 161a may include a NOR logic gate 1611a which has a plurality of input terminals for receiving the input vector IN. The input vector IN may be a N-bit input vector, in which each of the bits IN[0] to IN[N−1] of the input vector IN is inputted to one of the input terminals of the NOR logic gate 1611a. The pre-charge disabling circuit 161a may perform a NOR operation on the inputted bits IN[0] to IN[N−1] of the input vector IN to generate the disabling signal Dis_Pre. In some embodiments, the disabling signal Dis_Pre is in the first logic state of "1" when all of the inputted bits IN[0] to IN[N−1] of the input vector IN are in the second logic state of "0". In other words, the disabling signal Dis_Pre is in the first logic state of "1" when the input vector IN is a zero-input vector, where all bits of the zero-input vector are zero. Referring to FIG. 2, FIG. 3 and FIG. 4A, when the pre-charge disabling circuit 161a determines that the input vector IN is the zero-input vector, the pre-charge selecting circuit 160 outputs the gated pre-charge signal BL_RD_EN_g and the gated sensing signal SAENB_g to skip pre-charging the global bit line GBL and to disable the sense amplifier 140.

Figure 4B:
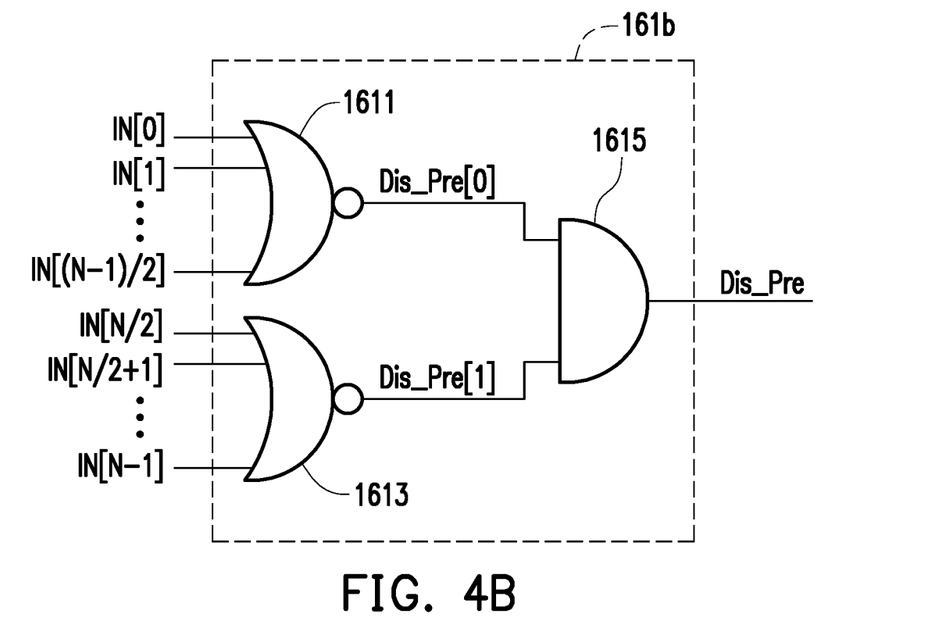

FIG. 4B illustrates a schematic diagram of a pre-charge disabling circuit 161b in accordance with some embodiments. The pre-charge disabling circuit 161b may be same as the pre-charge disabling circuit 161 of the pre-charge selecting circuit 160 in FIG. 2. The pre-charge disabling circuit 161b may include a first NOR logic gate 1611, a second NOR logic gate 1613 and a AND logic gate 1615, in which input terminals of the AND logic gate 1615 are coupled to output terminals of the first and second NOR logic gates 1611 and 1613. The first NOR logic gate 1611 is configured to receive a first number of bits (i.e., bits IN[0] to IN[(N−1)/2]) among the bits of the input vector IN, and the second NOR logic gate 1613 is configured to receive a second number of bits (i.e., bits IN[N/2] to IN[N−1] among the bits of the input vector IN. Each of the first NOR logic gate 1611 and the second NOR logic gate 1613 are configured to perform a NOR logic operation on the received bits. For example, the first NOR logic gate 1611 performs the NOR logic operation on the bits IN[0] to IN[(N−1)/2] to generate a signal Dis_Pre[0], and the second NOR logic gate 1613 performs the NOR logic operation on the bits IN[N/2] to IN[N−1] to generate a signal Dis_Pre[1]. In some embodiments, the signal Dis_Pre[0] is in the first logic state of "1" when all the bits IN[0] to IN[(N−1)/2] are zero bits, and the signal Dis_Pre[1] is in the first logic state of "1" when all the bits IN[N/2] to IN[N−1] are zero bits. The AND logic gate 1615 is configured to receive the signals Dis_Pre[0] and Dis_Pre[1], and is configured to perform an AND operation to the received signals Dis_Pre[0] and Dis_Pre[1] to generate the disabling signal Dis_Pre. In some embodiments, the disabling signal Dis_Pre is in the logic state of "1" when both of the signals Dis_Pre[0] and Dis_Pre[1] are in the logic state of "1". In other words, the pre-charge disabling circuit 161b outputs the disabling signal Dis_Pre in the first logic state of "1" when the bits IN[0] to IN[N−1] of the input vector IN are all zero. Referring to FIG. 2, FIG. 3 and FIG. 4B, when the pre-charge disabling circuit 161b determines that the input vector IN is the zero-input vector, the pre-charge selecting circuit 160 outputs the gated pre-charge signal BL_RD_EN_g and the gated sensing signal SAENB_g to skip pre-charging the global bit line GBL and to disable the sense amplifier 140.

Figure 4C:
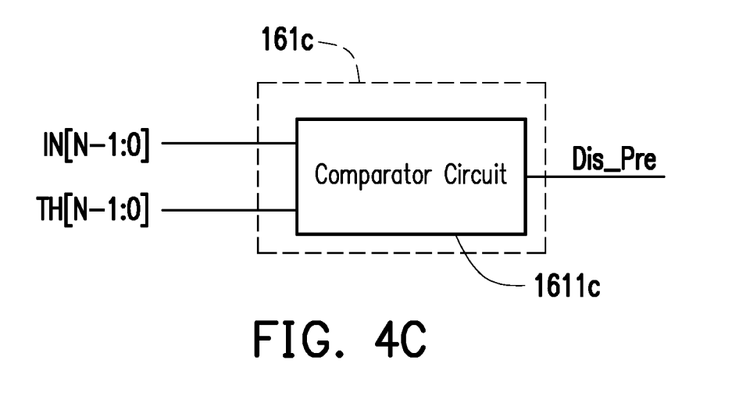

FIG. 4C illustrates a schematic diagram of a pre-charge disabling circuit 161c in accordance with some embodiments. The pre-charge disabling circuit 161c may be same as the pre-charge disabling circuit 161 of the pre-charge selecting circuit 160 in FIG. 2. The pre-charge disabling circuit 161c may include a comparator circuit 1611c that receives the input vector IN and the predefined threshold TH, and compares the value of the input vector IN and the predefined threshold TH to generate the disabling signal Dis_Pre. Each of the input vector IN and the predefined threshold TH may be a N-bit vector, where N is a positive integer; and the pre-charge disabling circuit 161c may compare each bit of the input vector IN to a corresponding bit of the predefined threshold TH to generate the disabling signal Dis_Pre. In some embodiments, the disabling signal Dis_Pre has the first logic state (i.e., logic state of "1") when the value of the input vector IN is less than the predefined threshold TH; and the disabling signal Dis_Pre has the second logic state (i.e., logic state of "0") when the value of the input vector IN is greater than or equal to the predefined threshold TH. Referring to FIG. 2, FIG. 3 and FIG. 4C, when the pre-charge disabling circuit 161c determines that the input vector IN is less than the predefined threshold TH, the pre-charge selecting circuit 160 outputs the gated pre-charge signal BL_RD_EN_g and the gated sensing signal SAENB_g to skip pre-charging the global bit line GBL and to disable the sense amplifier 140.

Figure 5A:
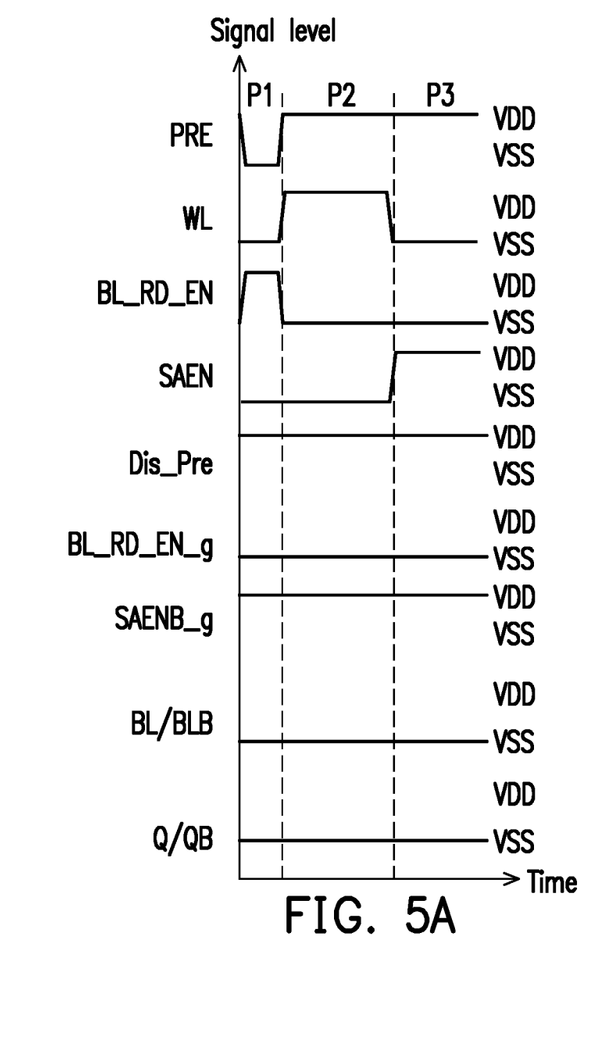
FIG. 5A and FIG. 5B are waveform diagrams of signals in a memory device in a read operation in accordance with some embodiments.
Figure 5B:
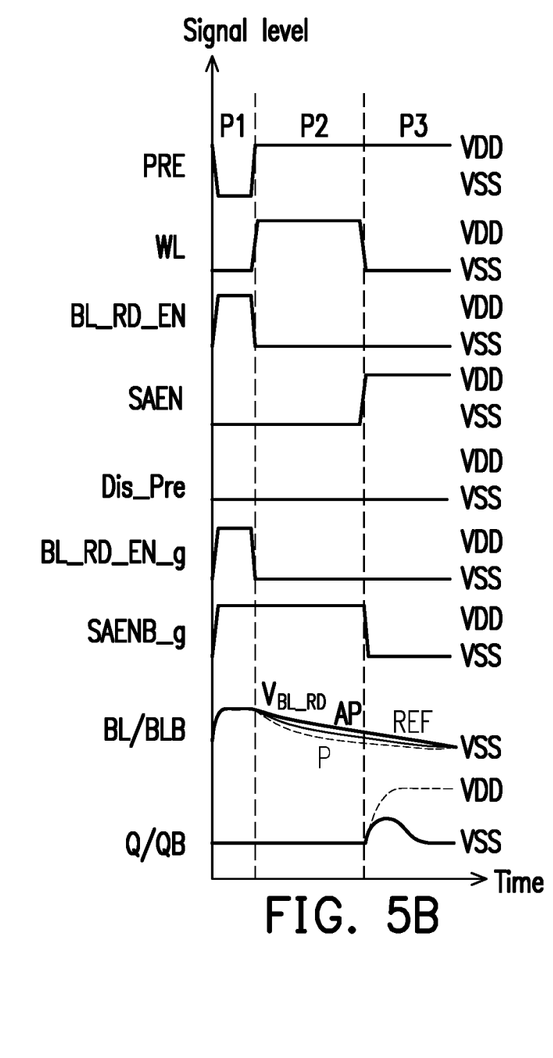

FIG. 5A and FIG. 5B illustrate waveforms of signals in a memory device (i.e., memory device 200 in FIG. 2) in a read operation in accordance with some embodiments. The read operation on the memory device may include a pre-charging phase P1, a developing phase P2 and a sensing phase P3, in which a bit line pre-charging is performed during the pre-charging phase P1, a bit line developing occurs during the developing phase P2, and a bit line sensing is performed during the sensing phase P3. The signals in FIG. 5A and FIG. 5B may include a pre-charge signal PRE, the word line signal WL, the read enabling signal BL_RD_EN, the sensing enabling signal SAEN, the disabling signal Dis_Pre, the gated sensing signal SAENB_g, bit line signals BL/BLB and a sensing output signal Q/QB. Referring to FIG. 2, FIG. 3, FIG. 5A and FIG. 5B, the pre-charge signal PRE is configured to enable pre-charging on at least one selected bit line of the memory device 200; the word line signal WL is provided to the switch 113 of the memory device 200, the read enabling signal BL_RD_EN and the sensing enabling signal SAEN are provided to the pre-charge selecting circuit 160; the disabling signal Dis_Pre is generated by the pre-charge disabling circuit 161; the gated sensing signal SAENB_g is provided to the pre-charging switch 105 of the memory device 200; the gated sensing signal SAENB_g is provided to the sense amplifier 140; and the bit line signals BL/BLB and a sensing output signal Q/QB are in the sense amplifier 140.

FIG. 5A illustrates waveforms of signals in a condition that the value of the input vector IN is less than the predefined threshold TH. When it determines that the input vector IN is less than the predefined threshold TH, the disabling signal Dis_Pre is in the first logic state of "1". As a result, the gated pre-charge signal BL_RD_EN_g is in the second logic state of "0" during the pre-charging phase P1, and the gated sensing signal SAENB_g is in the first logic state of "1" during the sensing phase P3. When the gated pre-charge signal BL_RD_EN_g with the second logic state of "0" is asserted to the pre-charging switch (i.e., pre-charging switch 105) during the pre-charging phase P1, the pre-charging switch is switched off during the pre-charging phase P1, and the global bit line GBL is not pre-charged during the pre-charging phase P1. When the gated sensing signal SAENB_g with the first logic state of "1" is asserted to the sense amplifier 140, the sense amplifier 140 is disabled during the sensing phase P3, resulting in the bit line signals BL/BLB and the sensing output signal Q/QB being at the second logic state of "0". It is appreciated that the first logic state of "1" may correspond to a power supply voltage VDD, and the second logic state of "0" may correspond to a power supply voltage VSS.

FIG. 5B illustrates waveforms of signals in a condition that the value of the input vector IN is greater than or equal to the predefined threshold TH. When it determines that the input vector IN is greater than or equal to the predefined threshold TH, the disabling signal Dis_Pre is in the second logic state of "0". As a result, the gated pre-charge signal BL_RD_EN_g is in the first logic state of "1" during the pre-charging phase P1, and the gated sensing signal SAENB_g is in the second logic state of "0" during the sensing phase P3. When the gated pre-charge signal BL_RD_EN_g with the first logic state of "1" is asserted to the pre-charging switch during the pre-charging phase P1, the pre-charging switch is switched on during the pre-charging phase P1, and the global bit line GBL is pre-charged during the pre-charging phase P1. In the developing phase P2, input signals (i.e., $V_{BL\_RD}$ and REF) are inputted to the sense amplifier, and the values on the bit lines BL and BLB are developed according to the states of the memory cell (i.e., parallel state A or anti-parallel state AP). In the sensing phase P3, when the gated sensing signal SAENB_g with the second logic state of "0" is asserted to the sense amplifier 140, the sense amplifier 140 is enabled to perform the sensing operation. The sensing result is outputted at the output terminal of the sense amplifier 140.

Figure 6:
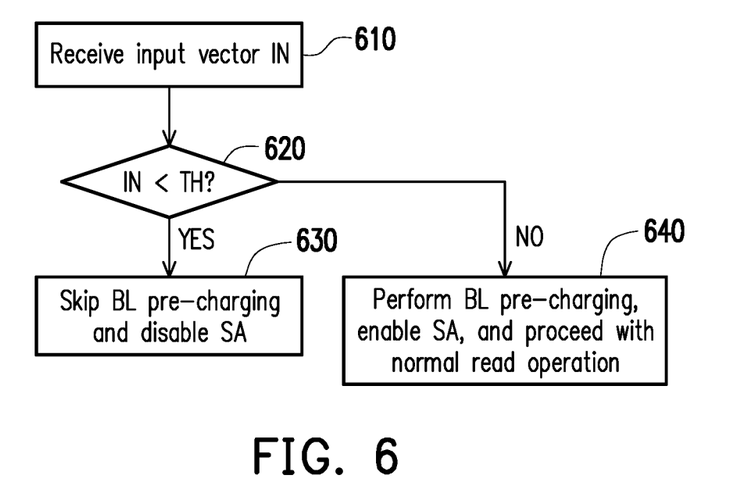
FIG. 6 is a flowchart diagram illustrating a reading method of the memory device accordance with some embodiments.

FIG. 6 illustrates a flowchart diagram of a reading method of a memory device (i.e., memory device 200 in FIG. 2) in accordance with some embodiments. Referring to FIG. 2 and FIG. 6, the pre-charge selecting circuit 160 receives an input vector IN (block 610). In block 620, the pre-charge selecting circuit 160 determines whether the value of the input vector IN is less than a predefined threshold TH. The predefined threshold TH may be a zero vector or a non-zero vector, and the value of the predefined threshold TH may be determined according to designed needs. When the value of the input vector IN is less than the predefined threshold TH, the reading method proceeds the block 630, in which the pre-charging of at least one selected bit line (i.e., global bit line GBL in FIG. 2) is skipped and the sense amplifier is disabled. In block 630, the pre-charge selecting circuit 160 may output a gated pre-charge signal and a gated sensing signal, so as to skip pre-charging at least one selected bit line (i.e., global bit line GBL in FIG. 2) and to disable the sense amplifier 140. When the value of the input vector IN is greater than or equal to the predefined threshold TH, the reading method proceeds the block 640, in which pre-charging is performed to pre-charge at least one selected bit line, the sense amplifier 140 is enabled, and the read operation is performed normally. For example, the sense amplifier 140 may sense the value in the at least one selected bit line, and output the sensed value at the output terminal of the sense amplifier 140.

Figure 7:
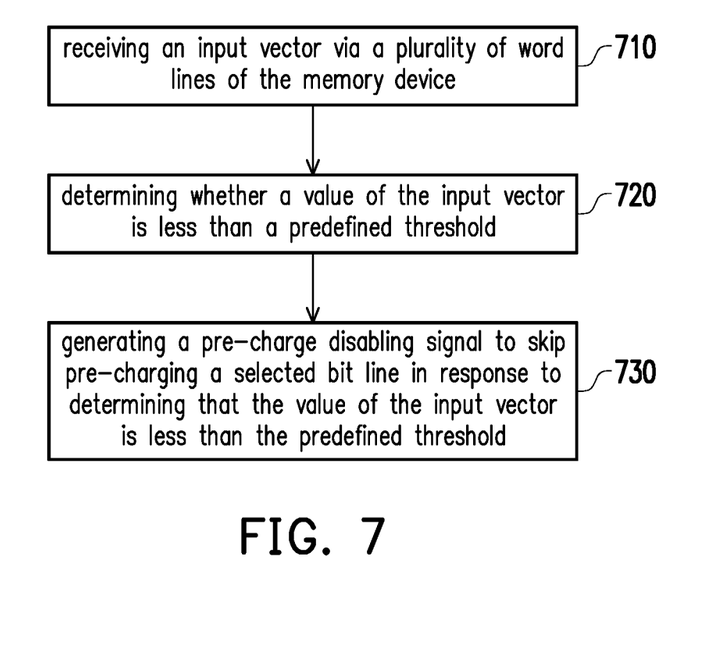
FIG. 7 is a flowchart diagram illustrating an operation method of the memory device accordance with some embodiments.

FIG. 7 illustrates a flowchart diagram of an operation method of a memory device (i.e., memory device 200 in FIG. 2) in accordance with some embodiments. In block 710, an input vector is received via a plurality of word lines of the memory device. In block 720, the operation method determines whether a value of the input vector is less than a predefined threshold. In block 730, a gated pre-charge signal is generated to skip pre-charging a selected bit line in response to determining that the value of the input vector is less than the predefined threshold.

In some embodiments of the disclosure, a memory device with a selective reading scheme that includes a selective pre-charge scheme and a selective sensing scheme is introduced. An input vector is compared to a predetermined threshold to determine whether a value of the input vector is less than the predetermined threshold. When it determines that the value of the input vector is less than the predetermined threshold, a pre-charging operation on at least one selected bit line is skipped and a sense amplifier is disabled. When it determines that the value of the input vector is greater than or equal to the predetermined threshold, the pre-charging operation on at least one selected bit line is performed and the sense amplifier is enabled to performed the sensing operation. In other words, the pre-charging of a selected bit line and an enablement of a sense amplifier of the memory device are selectively performed according to a sparsity of the input vector. In this way, the power consumption for the read operation is reduced while a computation accuracy is maintained (especially when the input vector is a zero vector or a very small vector). The selective reading scheme may be applicable for reading a weight vector from the bit lines of the memory based on the sparsity of the input vector, in which the input vector is known prior to the reading of the weight vector. The weight vector and the input vector may be used in a product-sum operation which is a dominant computing operation in many neural network applications.

In some embodiments, a memory device includes a memory array and a pre-charge selecting circuit. The memory array includes a plurality of memory cells that are coupled to a plurality of bit lines and a plurality of word lines, wherein the plurality of word lines are configured to receive an input vector. The pre-charge selecting circuit is configured to selectively pre-charge a selected bit line according to a value of the input vector. The pre-charge selecting circuit is configured to determine whether the value of the input vector is less than a predefined threshold, and generate a gated pre-charge signal to skip pre-charging the selected bit line in response to determining that the value of the input vector is less than the predefined threshold.

In some embodiments, a memory device includes a memory array, a sense amplifier and a pre-charge selecting circuit. The memory array includes a plurality of memory cells that are coupled to a plurality of bit lines and a plurality of word lines, wherein the plurality of word lines are configured to receive an input vector. The sense amplifier is coupled to the plurality of bit lines and the pre-charge selecting circuit, and is configured to sense the input vector through the plurality of bit lines. The pre-charge selecting circuit is configured to selectively pre-charge the selected bit line and selectively disabling the sense amplifier according a value of the input vector. The pre-charge selecting circuit is configured to determine whether the value of the input vector is less than a predefined threshold, and generate a gated pre-charge signal and a gated sensing signal in response to determining that the value of the input vector is less than the predefined threshold. The gated pre-charge signal is configured to skip pre-charging the selected bit line, and the gated sensing signal is configured to disable the sense amplifier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a memory array, comprising a plurality of memory cells that are coupled to a plurality of bit lines and a plurality of word lines, wherein the plurality of word lines are configured to receive an input vector;
    a pre-charge selecting circuit, selectively pre-charging a selected bit line according to a value of the input vector, wherein the pre-charge selecting circuit comprises:
        a pre-charge disabling circuit, receiving the input vector and the predefined threshold, comparing the value of the input with the predefined threshold, and generating a first disabling signal in response to determining that the value of the input vector is less than a predefined threshold; and
        a first logic circuit, coupled to the pre-charge disabling circuit, receiving the first disabling signal from the pre-charge disabling circuit and a read enabling signal, performing a first logic operation on the first disabling signal and an inverted signal of the read enabling signal to generate a gated pre-charge signal to skip pre-charging the selected bit line.

2. The memory device of claim 1, further comprising:
    a sense amplifier, coupled to the plurality of bit lines and the pre-charge selecting circuit, configured to sense the input vector through the plurality of bit lines, wherein the pre-charge selecting circuit is further configured to generate a gated sensing signal to disable sense amplifier in response to determining that the value of the input vector is less than the predefined threshold.

3. The memory device of claim 2, wherein
    the selected bit line is pre-charged in response to determining that the value of the input vector is greater than or equal to the predefined threshold,
    the sense amplifier is enabled to sense the selected bit line in response to determining that the value of the input vector is greater than or equal to the predefined threshold, and
    the memory device is configured to perform a product-sum operation on the input vector and a weight vector in response to determining that the value of the input vector is greater than or equal to the predefined threshold, wherein the weight vector is received through the plurality of bit lines of the memory device.

4. The memory device of claim 1, wherein the pre-charge selecting circuit further comprises:
    a second logic circuit, coupled to the pre-charge disabling circuit, receiving the first disabling signal from the pre-charge disabling circuit, and performing a second logic operation on the first disabling signal to generate a second disabling signal; and
    a third logic circuit, coupled to the second logic circuit, receiving the second disabling signal and a sensing enabling signal, performing a third operation to generate the gated sensing signal according to the second disabling signal and the sensing enabling signal,
    wherein the pre-charge selecting circuit is configured to assert the gated sensing signal to the sense amplifier, and the sense amplifier is disabled when the gated sensing signal is asserted to the sense amplifier.

5. The memory device of claim 4, wherein
    the first logic circuit is a NOR logic gate,
    the second logic circuit is a NOT logic gate, and
    the third logic circuit is a NAND logic gate.

6. The memory device of claim 1, wherein
    each of the input vector and the predefined threshold is a n-bit vector, and
    the pre-charge disabling circuit comprises a comparator circuit that is configured to compare the bit values of the input vector with n bit values of the predefined threshold to generate the first disabling signal.

7. The memory device of claim 1, wherein
    the input vector is a n-bit vector, and
    a fourth logic circuit, receiving n bit values of the input vector, and performing a fourth logic operation on the bit values of the input vector to generate the first disabling signal.

8. The memory device of claim 1, wherein
    the input vector is a n-bit vector, and
    the pre-charge disabling circuit comprises:
        a fifth logic circuit, receiving a first n/2 bit values of the input vector, performing a fifth logic operation on the first n/2 bit values of the input vector to generate a first signal;
        a sixth logic circuit, receiving a second n/2 bit values of the input vector, performing a sixth logic operation on the second n/2 bit values of the input vector to generate a second signal; and
        a seventh logic circuit, coupled to the fifth logic circuit and the sixth logic circuit, receiving the first signal and the second signal, performing a seventh logic operation on the first signal and the second signal to generate the first disabling signal.

9. A memory device, comprising:
    a memory array, comprising a plurality of memory cells that are coupled to a plurality of bit lines and a plurality of word lines, wherein the plurality of word lines are configured to receive an input vector;
    a sense amplifier, coupled to the plurality of bit lines, configured to sense the input vector through the plurality of bit lines; and
    a pre-charge selecting circuit, selectively pre-charging the selected bit line and selectively disabling the sense amplifier according a value of the input vector, wherein the pre-charge selecting circuit comprises:
        a pre-charge disabling circuit, receiving the input vector and the predefined threshold, comparing the value of the input with the predefined threshold, and generating a first disabling signal in response to determining that the value of the input vector is less than a predefined threshold; and a first logic circuit, coupled to the pre-charge disabling circuit, receiving the first disabling signal from the pre-charge disabling circuit and a read enabling signal, performing a first logic operation on the first disabling signal and an inverted signal of the read enabling signal to generate a gated pre-charge signal and a gated sensing signal in response to determining that the value of the input vector is less than the predefined threshold, wherein the gated pre-charge signal is configured to skip pre-charging the selected bit line, and the gated sensing signal is configured to disable the sense amplifier.

10. The memory device of claim 9, wherein the selected bit line is pre-charged in response to determining that the value of the input vector is greater than or equal to the predefined threshold, the sense amplifier is enabled to sense the selected bit line in response to determining that the value of the input vector is greater than or equal to the predefined threshold, and the memory device is configured to perform a product-sum operation on the input vector and a weight vector in response to determining that the value of the input vector is greater than or equal to the predefined threshold, wherein the weight vector is received through the plurality of bit lines of the memory device.

11. The memory device of claim 9, wherein the pre-charge selecting circuit further comprises:

a second logic circuit, coupled to the pre-charge disabling circuit, receiving the first disabling signal from the pre-charge disabling circuit, and performing a second logic operation on the first disabling signal to generate a second disabling signal; and a third logic circuit, coupled to the second logic circuit, receiving the second disabling signal and a sensing enabling signal, generating a gated sensing signal according to the second disabling signal and the sensing enabling signal, wherein the pre-charge selecting circuit is configured to assert the gated sensing signal to the sense amplifier, and the sense amplifier is disabled when the gated sensing signal is asserted to the sense amplifier.

12. The memory device of claim 11, wherein the first logic circuit is a NOR logic gate, the second logic circuit is a NOT logic gate, and the third logic circuit is a NAND logic gate.

13. The memory device of claim 11, wherein the input vector is a n-bit vector, and a fourth logic circuit, receiving n bit values of the input vector, and performing a fourth logic operation on the bit values of the input vector to generate the first disabling signal.

14. The memory device of claim 11, wherein the input vector is a n-bit vector, and the pre-charge disabling circuit further comprises:

a fifth logic circuit, receiving a first n/2 bit values of the input vector, performing a fifth logic operation on the first n/2 bit values of the input vector to generate a first signal;

a sixth logic circuit, receiving a second n/2 bit values of the input vector, performing a sixth logic operation on the second n/2 bit values of the input vector to generate a second signal; and a seventh logic circuit, coupled to the fifth logic circuit and the sixth logic circuit, receiving the first signal and the second signal, performing a seventh logic operation on the first signal and the second signal to generate the first disabling signal.

15. The memory device of claim 11, wherein each of the input vector and the predefined threshold is a n-bit vector, and the pre-charge disabling circuit comprises a comparator circuit that is configured to compare the bit values of the input vector with n bit values of the predefined threshold to generate the first disabling signal.

16. An operation method of a memory device, comprising:

receiving an input vector via a plurality of word lines of the memory device;

determining whether a value of the input vector is less than a predefined threshold; and generating a gated pre-charge signal to skip pre-charging a selected bit line in response to determining that the value of the input vector is less than the predefined threshold, wherein generating the gated pre-charge signal comprises:

comparing the value of the input with the predefined threshold, generating a first disabling signal in response to determining that the value of the input is less than the predefined threshold;

receiving read enabling signal; and performing a first logic operation on the first disabling signal and an inverted signal of the read enabling signal to generate the gated pre-charge signal.

17. The operation method of claim 16, further comprising:

generating a gated sensing signal in response to determining that the value of the input vector is less than the predefined threshold; and disabling a sense amplifier of the memory device according to the gated sensing signal.

18. The operation method of claim 16, wherein generating the gated sensing signal further comprises:

performing a second logic operation on the first disabling signal to generate a second disabling signal;

receiving a sensing enabling signal; and performing a third operation to generate the gated sensing signal according to the second disabling signal and the sensing enabling signal.

* * * * *